(12) United States Patent
Tsai et al.

(10) Patent No.: US 12,328,886 B2
(45) Date of Patent: Jun. 10, 2025

(54) METAL-INSULATOR-METAL CAPACITOR AND METHODS OF MANUFACTURING

(71) Applicant: Taiwan Semiconductor Manufacturing Company, Ltd., Hsinchu (TW)

(72) Inventors: Min-Ying Tsai, Kaohsiung (TW); Chih-Ping Chang, Tainan (TW); Ching I Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 84 days.

(21) Appl. No.: 17/662,571

(22) Filed: May 9, 2022

(65) Prior Publication Data
US 2023/0361164 A1   Nov. 9, 2023

(51) Int. Cl.
*H10D 1/68* (2025.01)
*H10D 1/00* (2025.01)
*H10D 1/66* (2025.01)

(52) U.S. Cl.
CPC ............ *H10D 1/696* (2025.01); *H10D 1/042* (2025.01); *H10D 1/047* (2025.01); *H10D 1/665* (2025.01); *H10D 1/714* (2025.01); *H10D 1/716* (2025.01)

(58) Field of Classification Search
CPC ......... H01L 28/75; H01L 28/87; H01L 28/91; H01L 29/66181; H01L 29/945; H01L 28/40; H01L 28/07; H10D 1/696; H10D 1/042; H10D 1/047; H10D 1/665; H10D 1/714; H10D 1/716; H10D 1/684; F27D 17/28; H10H 20/814; H02K 15/0434
See application file for complete search history.

(56) References Cited

U.S. PATENT DOCUMENTS

| | | | |
|---|---|---|---|
| 6,806,138 B1 * | 10/2004 | Cheng | H01L 29/945 438/386 |
| 10,090,342 B1 * | 10/2018 | Gambino | H01L 27/14609 |
| 2002/0074584 A1 * | 6/2002 | Yang | G11C 11/404 257/E21.59 |
| 2006/0221667 A1 * | 10/2006 | Ogura | H01L 27/14632 365/149 |

(Continued)

*Primary Examiner* — Khaja Ahmad
*Assistant Examiner* — Khatib A Rahman
(74) *Attorney, Agent, or Firm* — Harrity & Harrity, LLP

(57) ABSTRACT

Some implementations described herein provide a semiconductor device and methods of formation. The semiconductor device may include a photodiode device electrically connected to a metal-insulator-metal deep-trench capacitor. The metal-insulator-metal deep-trench capacitor includes a layer of an amorphous material between an insulator layer stack of the deep-trench capacitor structure and a capacitor bottom metal layer of the metal-insulator-metal deep-trench capacitor. The amorphous material includes a bandgap energy level that provides a conduction band offset and lowers a probability of electron tunneling from the capacitor bottom metal electrode layer to the insulator layer stack. In this way, leakage associated with grain boundaries, crystal defects, and interfaces of a bottom layer of the insulator layer stack may be overcome to improve a lag performance of the semiconductor device including the metal-insulator-metal deep-trench capacitor.

20 Claims, 17 Drawing Sheets

(56) References Cited

U.S. PATENT DOCUMENTS

| | | | |
|---|---|---|---|
| 2011/0115005 A1* | 5/2011 | Coolbaugh | H01L 27/0629 257/296 |
| 2013/0307118 A1* | 11/2013 | Tu | H10D 1/694 257/532 |
| 2014/0235019 A1* | 8/2014 | Tzeng | H01L 23/49822 438/126 |
| 2015/0235944 A1* | 8/2015 | Filippi | H01L 21/76898 257/532 |
| 2015/0311273 A1* | 10/2015 | Lin | H01L 28/40 257/532 |
| 2016/0204190 A1* | 7/2016 | Chu | H01L 23/5226 257/532 |
| 2017/0069710 A1* | 3/2017 | Che | H01L 28/60 |
| 2017/0271434 A1* | 9/2017 | Chou | H10D 1/692 |
| 2018/0197946 A1* | 7/2018 | Leobandung | H10D 1/716 |
| 2020/0098925 A1* | 3/2020 | Dewey | H01L 29/78391 |
| 2021/0136275 A1* | 5/2021 | Solhusvik | H04N 25/778 |
| 2023/0326958 A1* | 10/2023 | Huang | H01L 23/528 257/532 |

\* cited by examiner

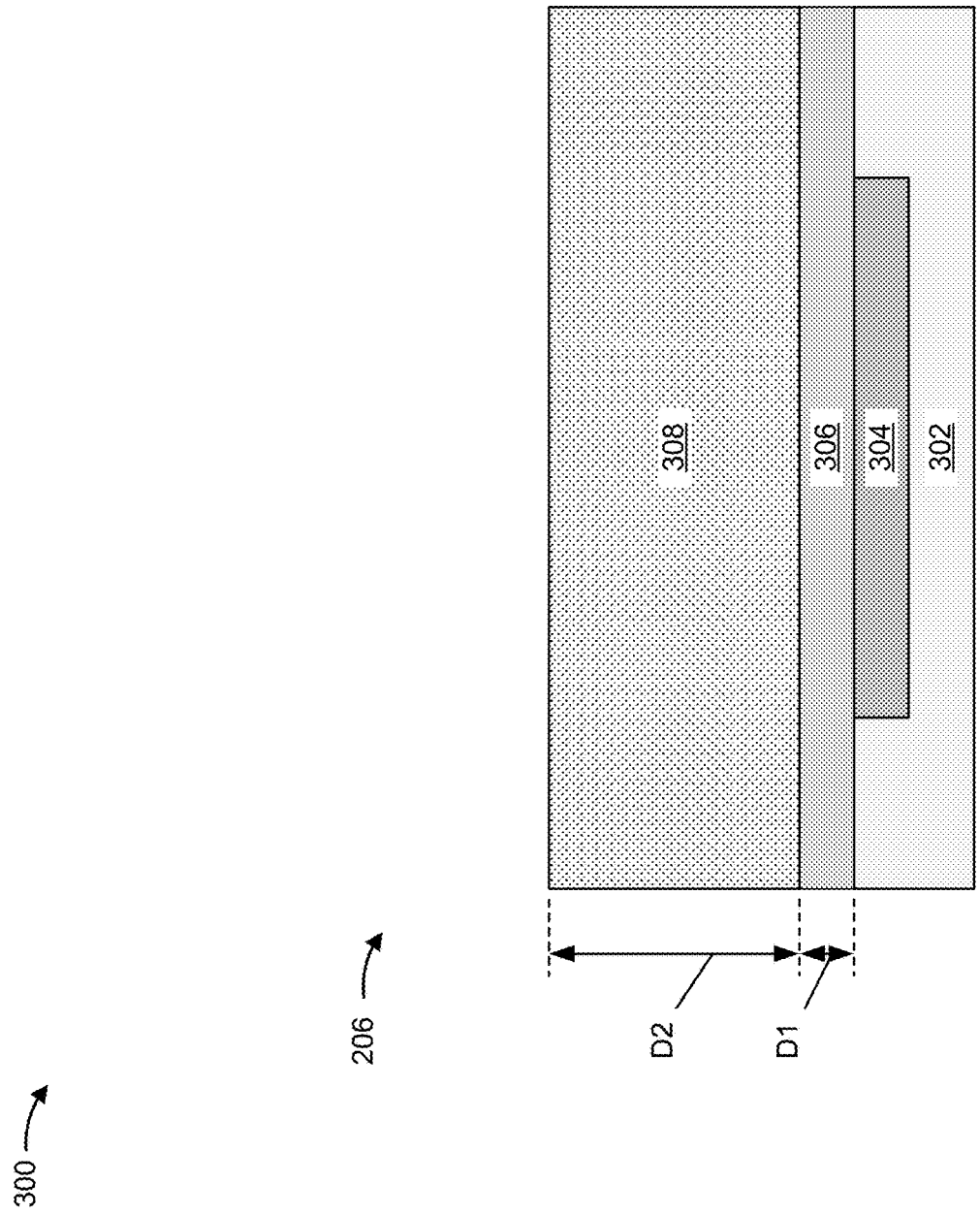

METAL-INSULATOR-METAL CAPACITOR AND METHODS OF MANUFACTURING

BACKGROUND

A metal-insulator-metal (MIM) device can be used as a capacitor in a semiconductor device. A MIM device includes two metal layers, with an insulator layer between the two metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3G, 4, and 5A-5D are diagrams of an example implementation described herein.

DETAILED DESCRIPTION

Figure 1:
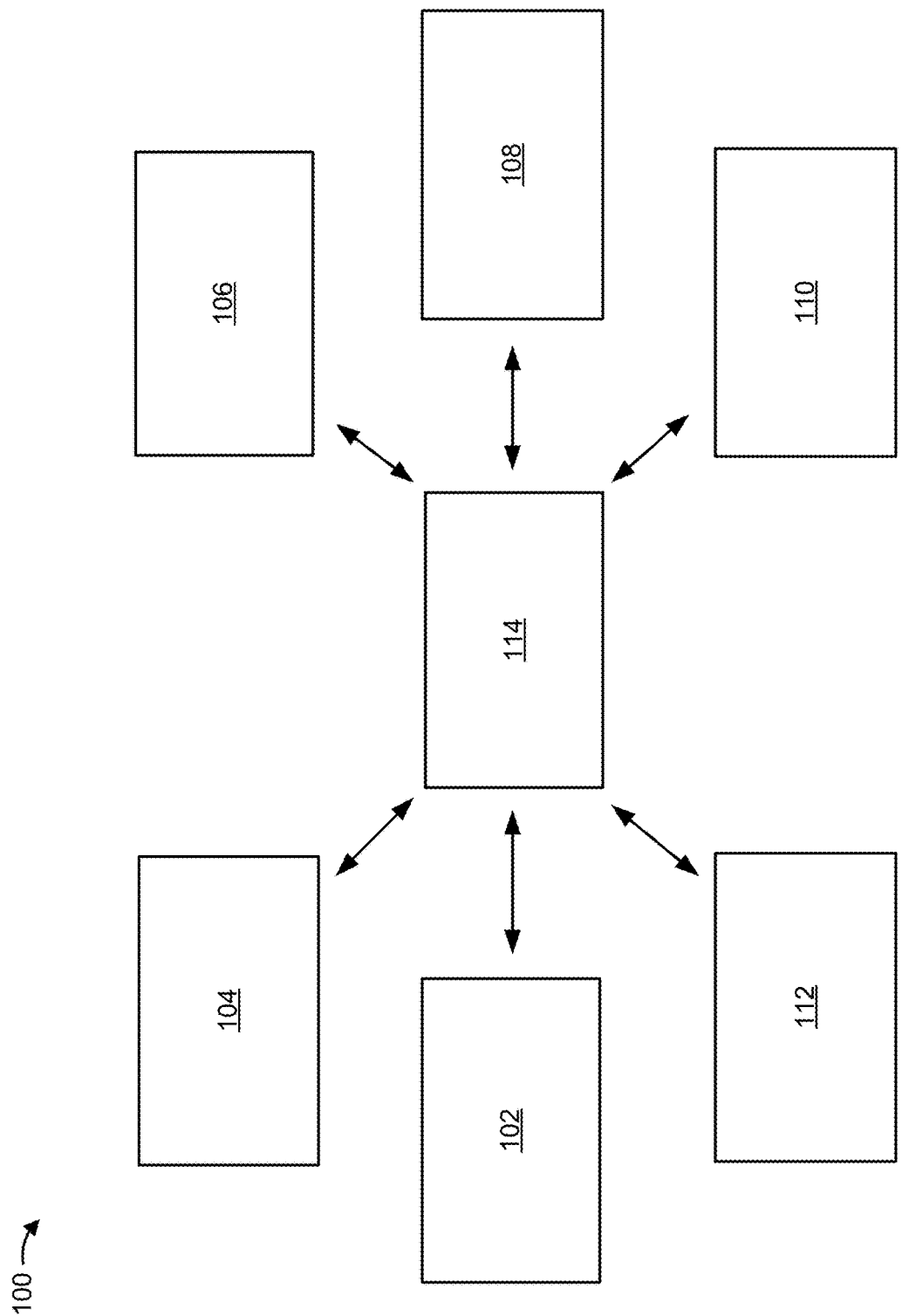
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal oxide semiconductor (CMOS) image sensor may include a plurality of pixel sensors. Each pixel sensor of the CMOS image sensor may include a photodiode region configured to convert photons of incident light into a photocurrent of electrons, a transfer gate configured to control the flow of the photocurrent between the photodiode region and a floating diffusion region, and a drain region in the floating diffusion region configured to receive the photocurrent such that the photocurrent can be measured and/or transferred to other areas of the CMOS image sensor.

Each pixel sensor may include a metal-insulator-metal (MIM) deep-trench capacitor structure. Dielectric layers included in the MIM deep-trench capacitor structure may include grain boundary defects, crystal defects, and interface traps that cause image lag issues or afterimage issues within the MIM deep-trench capacitor. Such defects and traps may cause performance issues within the CMOS image sensor, such as decreasing a lag performance across frames of an image captured by the CMOS image sensor.

Some implementations described herein provide a semiconductor device and methods of formation. The semiconductor device may include a photodiode device electrically connected to a MIM deep-trench capacitor. The MIM deep-trench capacitor includes a layer of an amorphous material between an insulator layer stack of the deep-trench capacitor structure and a capacitor bottom metal (CBM) layer of the MIM deep-trench capacitor. The amorphous material includes a bandgap energy level that provides a conduction band offset and lowers a probability of electron tunneling from the CBM electrode layer to the insulator layer stack.

In this way, leakage associated with grain boundaries, crystal defects, and interfaces of a bottom layer of the insulator layer stack may be overcome to improve a lag performance of the semiconductor device including the MIM deep-trench capacitor.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between the semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2-8 and elsewhere herein, the semiconductor processing tools 102-112 may perform a combination of operations to form layers of a MIM deep-trench capacitor. As an example, the combination of operations includes forming a capacitor bottom metal (CBM) electrode layer along contours of a trench region that extends into a stack of one or more dielectric layers and forming an amorphous material layer along contours of the CBM electrode layer. In some implementations, the amorphous material layer includes a first bandgap. The combination of operations also includes forming an insulator layer stack along contours of the amorphous material layer. In some implementations, a bottom layer of the insulator layer stack includes a second bandgap that is lesser relative to the first bandgap. The combination of operations also includes forming a capacitor top metal (CTM) electrode layer on the insulator layer stack.

To address lag performance issues of a CMOS image sensor device, the combination of operations may include first depositing a high bandgap material, followed by depositing an insulator material. In the CMOS image sensor device, the amorphous material layer may include multiple combined layers (e.g., layers having smaller bandgaps combined with layers having larger bandgaps, among other examples) to improve a leakage performance within the CMOS image sensor device.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
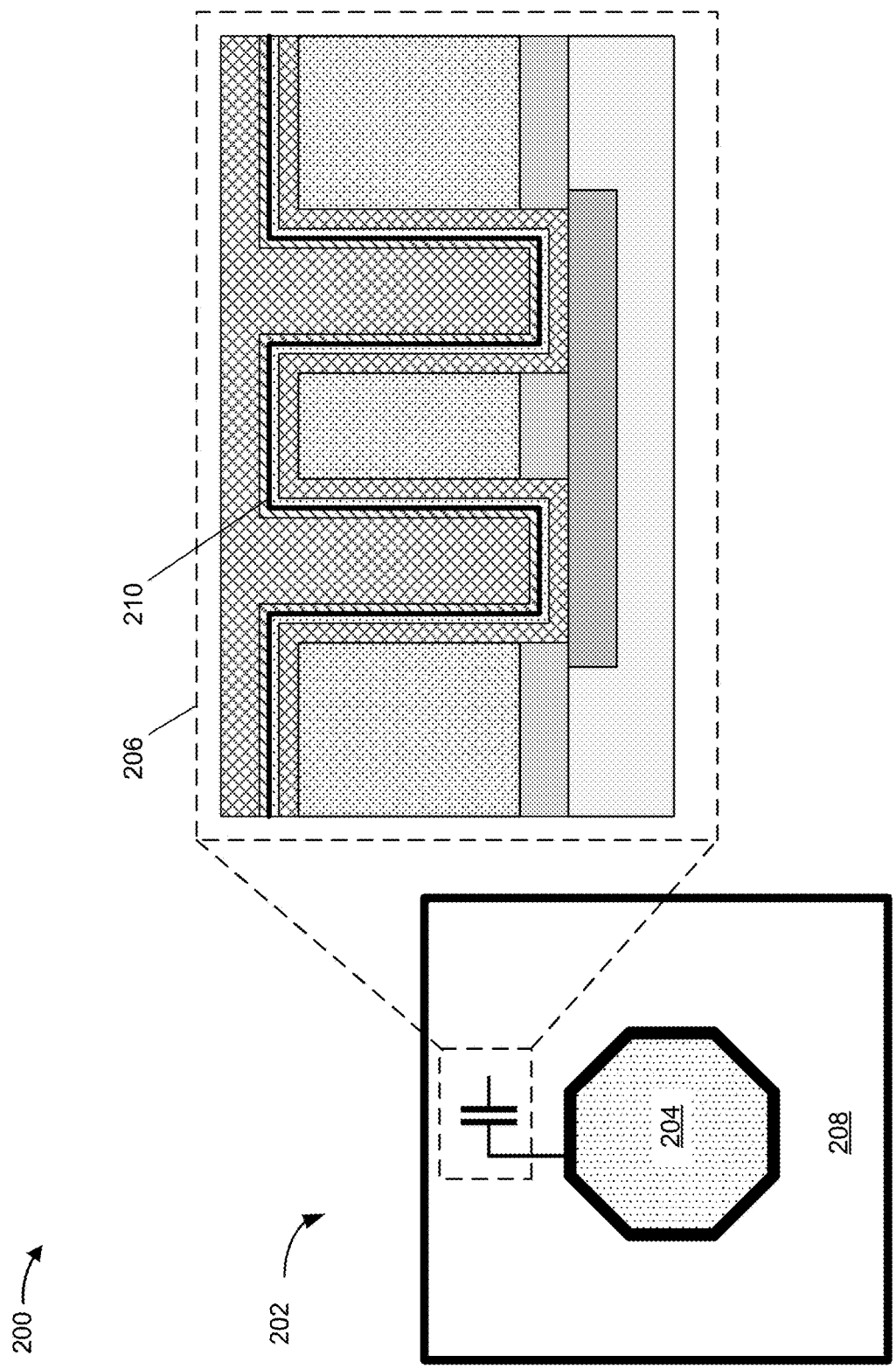
FIG. 2 is a diagram of an example semiconductor device including a MIM device described herein.

FIG. 2 is a diagram of an example implementation 200 of a semiconductor device 202 described herein. The semiconductor device 202 may include integrated circuitry having a photodiode 204 that is electrically connected to a capacitor structure 206.

The semiconductor device 202 may correspond to an image sensor type of semiconductor device (e.g., a complimentary metal-oxide semiconductor (CMOS) image sensor device, among other examples) including the photodiode 204 that is electrically connected to the capacitor structure 206. The photodiode 204 and the capacitor structure 206 may be included in a pixel 208 of a pixel array.

The capacitor structure 206 may be configured as a lateral overflow integration capacitor. The capacitor structure 206 may correspond to a MIM capacitor structure. Additionally, or alternatively, the capacitor structure 206 may correspond to a deep-trench capacitor structure. However, other types and configurations of the semiconductor device 202, and/or the capacitor structure 206, are within the scope of the present disclosure.

An amorphous material layer 210 is included in the capacitor structure 206. As an example, the amorphous material layer 210 may include a high bandgap material such as an aluminum monoxide (AlO) material, an aluminum oxide ($Al_2O_3$) material, or a silicon dioxide ($SiO_2$) material. Additionally, or alternatively, the amorphous material layer 210 may include a hafnium silicate ($HfSiO_4$) material, a lanthanum oxide ($La_2O_3$) material, an aluminum nitride (AlN) material, or a zirconium silicate ($ZrSiO_4$) material, among other examples. The amorphous material layer 210 includes a high bandgap material that reduces a likelihood of tunneling of electrons across material layers of the capacitor structure 206 to reduce a leakage within the capacitor structure 206 and improve a lag performance of the semiconductor device 202 (e.g., the CMOS image sensor).

In some implementations, and described in connection with FIGS. 3A-8 and elsewhere herein, a semiconductor device (e.g., the semiconductor device 202) includes a capacitor structure (e.g., the capacitor structure 206). The capacitor structure 206 includes a CBM electrode layer and an amorphous material layer (e.g., the amorphous material layer 210) over the CBM electrode layer. In some implementations, the amorphous material layer includes a first bandgap. The capacitor structure 206 further includes an insulator layer stack including a bottom layer on the amorphous material layer 210. In some implementations, the bottom layer includes a second bandgap that is lesser relative to the first bandgap. The semiconductor device further includes a photodiode (e.g., the photodiode 204) that is electrically connected to the capacitor structure 206. In some implementations, a CTM electrode layer is over an insulator layer including a material with a high dielectric constant, the amorphous material layer 210, and the CBM electrode layer Additionally, or alternatively, a device (e.g., the semiconductor device 202) includes a metal layer and the capacitor structure 206 over the metal layer. The capacitor structure 206, which may correspond to a deep-trench capacitor structure, includes a CBM electrode layer on the metal layer, a coating treatment layer on the CBM electrode layer, and an amorphous material layer (e.g., the amorphous material layer 210) on the coating treatment layer. In some implementations, the amorphous material layer includes a first bandgap. The capacitor structure 206 further includes an insulator layer sack on the amorphous material layer. In some implementations, the insulator layer stack includes a bottom material layer having a second bandgap that is lesser relative to the first bandgap. In some implementations, the coating treatment layer corresponds to an oxidized layer.

As indicated above, FIG. 2 is provided as an example. Other examples may differ from what is described with regard to FIG. 2.

FIGS. 3A-3G are diagrams of an example implementation 300 described herein. In connection with FIGS. 3A-3G, a series of operations may be performed by one or more of the semiconductor processing tools 102-112 to form the capacitor structure 206 (e.g., a deep-trench capacitor structure). FIGS. 3A-3G include example section-views of the capacitor structure 206 during formation of the capacitor structure 206.

FIG. 3A shows a partial formation of the capacitor structure 206, including a lower inter-metal dielectric (IMD) layer 302. The lower IMD layer 302 (e.g., which may be over other material layers of the semiconductor device 202) may include a silicon oxide ($SiO_x$) material or a silicon nitride ($Si_xN_y$) material, among other examples. The lower IMD layer 302 may provide electrical isolation between metal layers or other features of the semiconductor device 202. The deposition tool 102 may deposit the lower IMD layer 302 over other material layers of the semiconductor device 202 using a CVD technique, a PVD technique, an ALD technique described above in connection with FIG. 1, and/or another deposition technique.

A metal layer 304 is over the lower IMD layer 302. The metal layer 304 may include a copper (Cu) material, a cobalt (Co) material, a tungsten (W) material, a ruthenium material (Ru), a metal alloy material, or another type of conductive material. The metal layer 304 may provide electrical connectively between the capacitor structure 206 and other features (e.g., integrated circuitry) of the semiconductor device 202, such as the photodiode 204. The deposition tool 102 may deposit the metal layer 304 using a CVD technique, a PVD technique, an ALD technique described above in connection with FIG. 1, and/or another deposition technique. Alternatively, the plating tool 112 may deposit the metal layer 304 as described above in connection with FIG. 1.

As shown in FIG. 3A, an inter-layer dielectric (ILD) layer 306 is over the lower IMD layer 302 and the metal layer 304. The ILD layer 306 may include a silicon carbide (SiC) material, among other examples. The ILD layer 306 may provide electrical isolation between other layers and/or features of the semiconductor device 202. The deposition tool 102 may deposit the ILD layer 306 using a CVD technique, a PVD technique, an ALD technique described above in connection with FIG. 1, and/or another deposition technique. The ILD layer 306 may have a thickness D1. As an example, the thickness D1 may be included in a range of approximately 500 angstroms to approximately 600 angstroms. However, other values and ranges for the thickness D1 are within the scope of the present disclosure.

An upper IMD layer 308 is over the ILD layer 306. The upper IMD layer 308 may include a silicon oxide ($SiO_x$) material or a silicon nitride ($Si_xN_y$) material, among other examples. The upper IMD layer 308 may provide electrical isolation between metal layers or other features of the semiconductor device 202. The deposition tool 102 may deposit the upper IMD layer 308 using a CVD technique, a PVD technique, an ALD technique described above in connection with FIG. 1, and/or another deposition technique. The upper IMD layer 308 may have a thickness D2. As an example, the thickness D2 may be included in a range of approximately 2250 angstroms to approximately 2750 angstroms. However, other values and ranges for the thickness D2 are within the scope of the present disclosure.

Figure 3B:
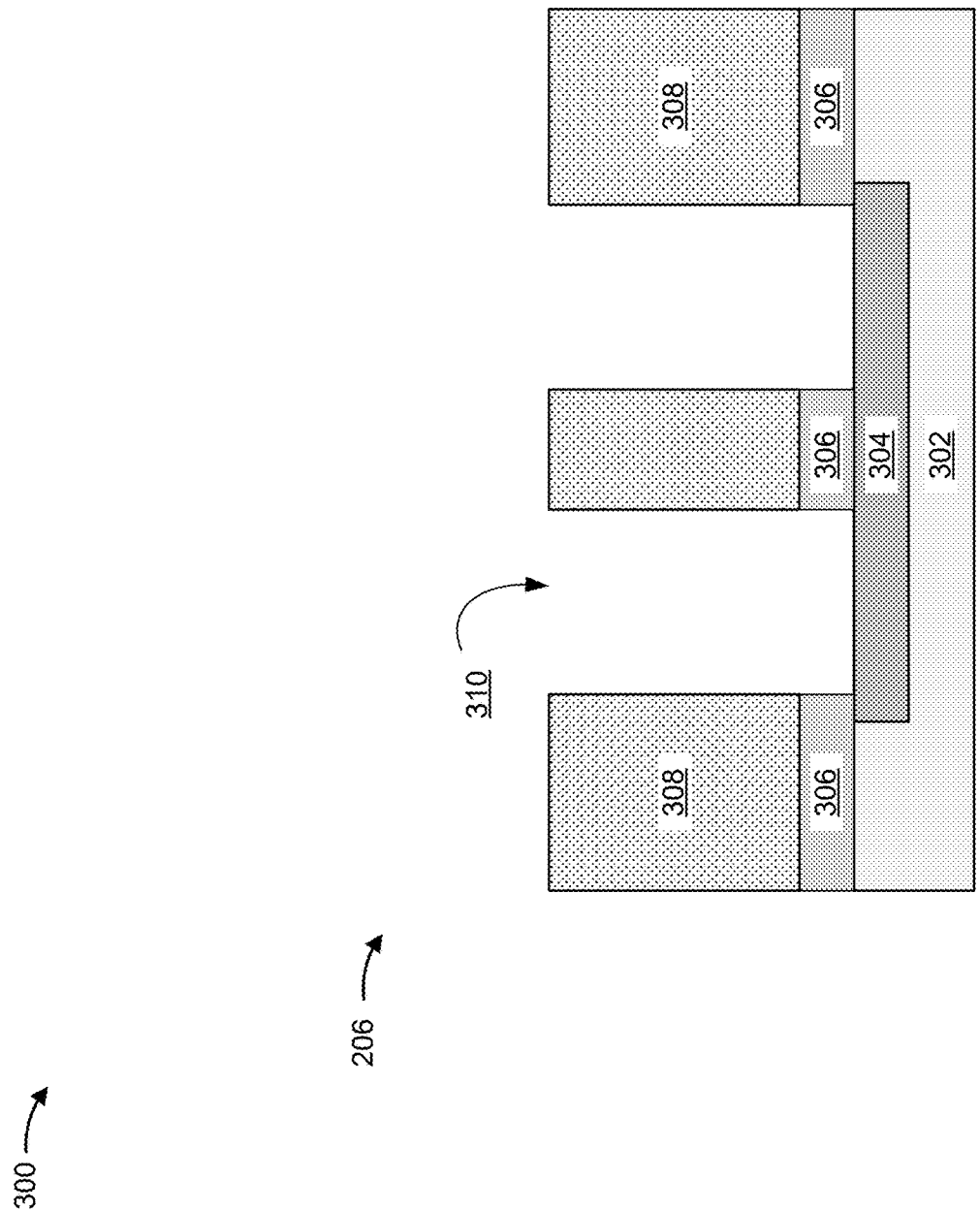

FIG. 3B shows a forming of one or more trench regions 310 (e.g., deep trenches) in the capacitor structure 206. The one or more trench regions 310 may extend into a stack of one or more dielectric layers (e.g., the upper IMD layer 308 and the ILD layer 306). Furthermore, and as shown, the one or more trench regions 310 may expose surfaces of the metal layer 304. The etch tool 108 may form the one or more trench regions 310 using a plasma etch technique, a wet chemical etch technique, another type of etch technique described above in connection with FIG. 1, and/or another etch technique.

Figure 3C:
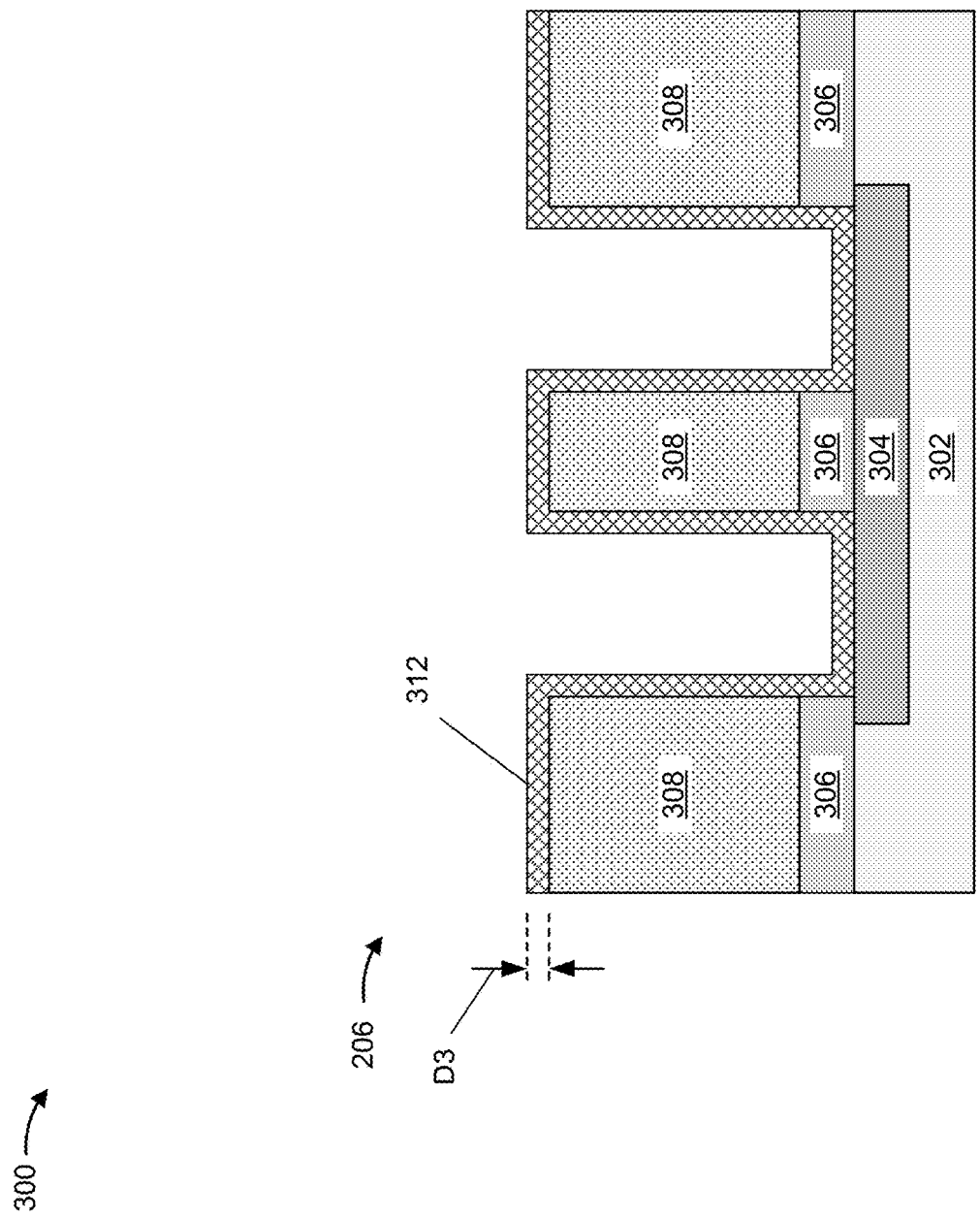

As shown in FIG. 3C, a capacitor bottom metal (CBM) electrode layer 312 is formed along contours of the one or more trench regions 310. Portions of the CBM electrode layer 312 may electrically connect to the metal layer 304. The CBM electrode layer 312 may include one or more of a tantalum (Ta) material, a tantalum nitride (TaN) material, or a titanium nitride (TiN) material, among other examples. In some implementations, the deposition tool 102 deposits one or more layers of the CBM electrode layer 312 using a series of one or more deposition techniques. Such deposition techniques may include a CVD technique, a PVD technique, an ALD technique described above in connection with FIG. 1, and/or another deposition technique. A thickness D3 of the CBM electrode layer 312 may be included in a range of approximately 180 angstroms to approximately 220 angstroms. However, other values and ranges for the thickness D3 are within the scope of the present disclosure.

Figure 3D:
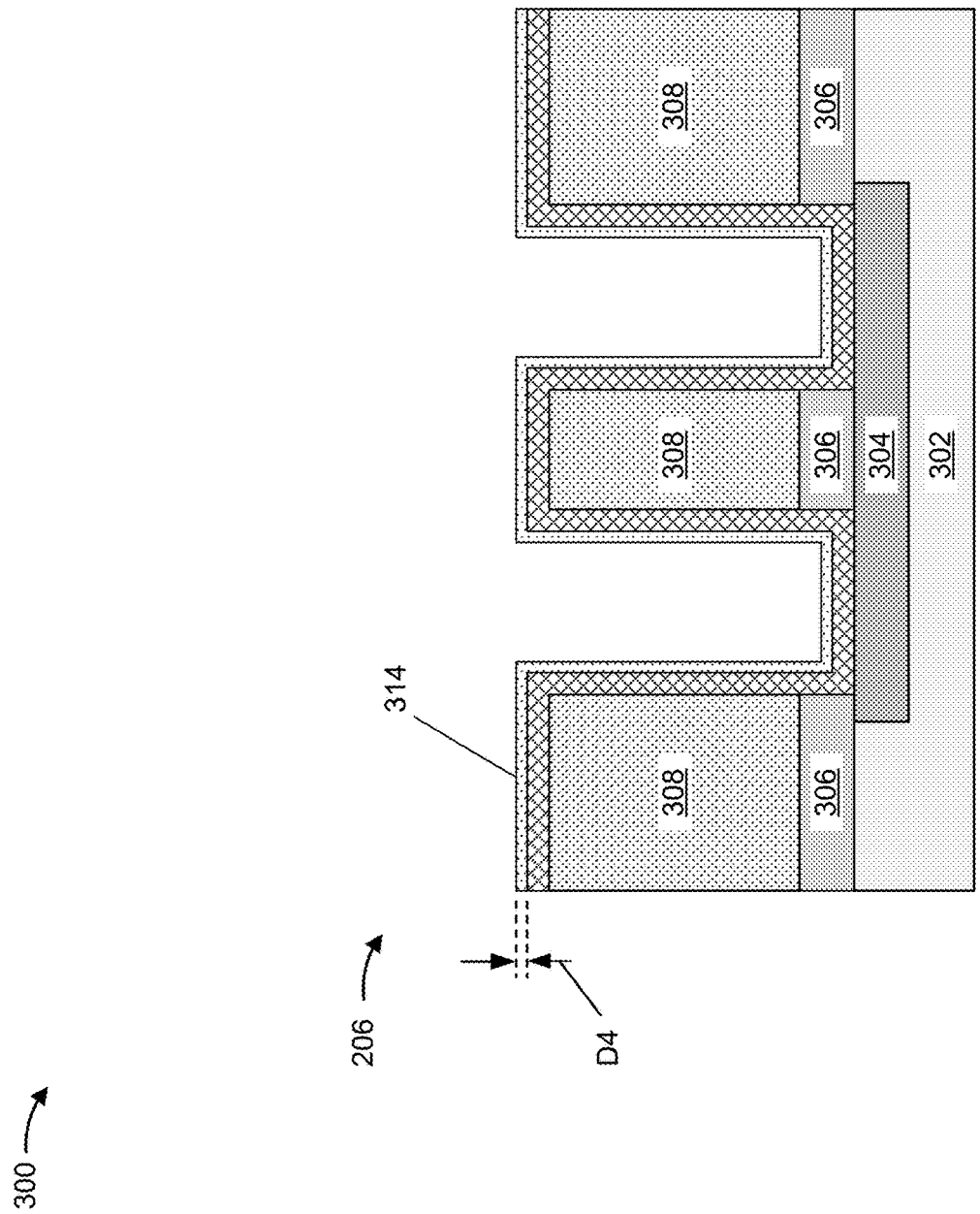

In some implementations, and as shown in FIG. 3D, a coating treatment layer 314 is formed over the CBM electrode layer 312. The coating treatment layer 314 may reduce a likelihood of oxygen vacancies (e.g., oxygen vacancies which may cause electron migration and/or leakage) from forming in a subsequently formed high-k dielectric film of the capacitor structure 206. Some configurations of the capacitor structure 206 may not include the coating treatment layer 314.

To form the coating treatment layer 314 (e.g., an oxidized layer, among other examples), the CBM electrode layer 312 may be exposed to a nitrous oxide (e.g., $N_2O$) in a chamber of the deposition tool 102 to form a titanium oxy nitride (TiON) coating (e.g., the coating treatment layer 314 includes a titanium oxy nitride material). A thickness D4 of the coating treatment layer 314 may be included in a range of approximately 4 nanometers to approximately 7 nanometers. However, other values and ranges for the thickness D4 are within the scope of the present disclosure.

Figure 3E:
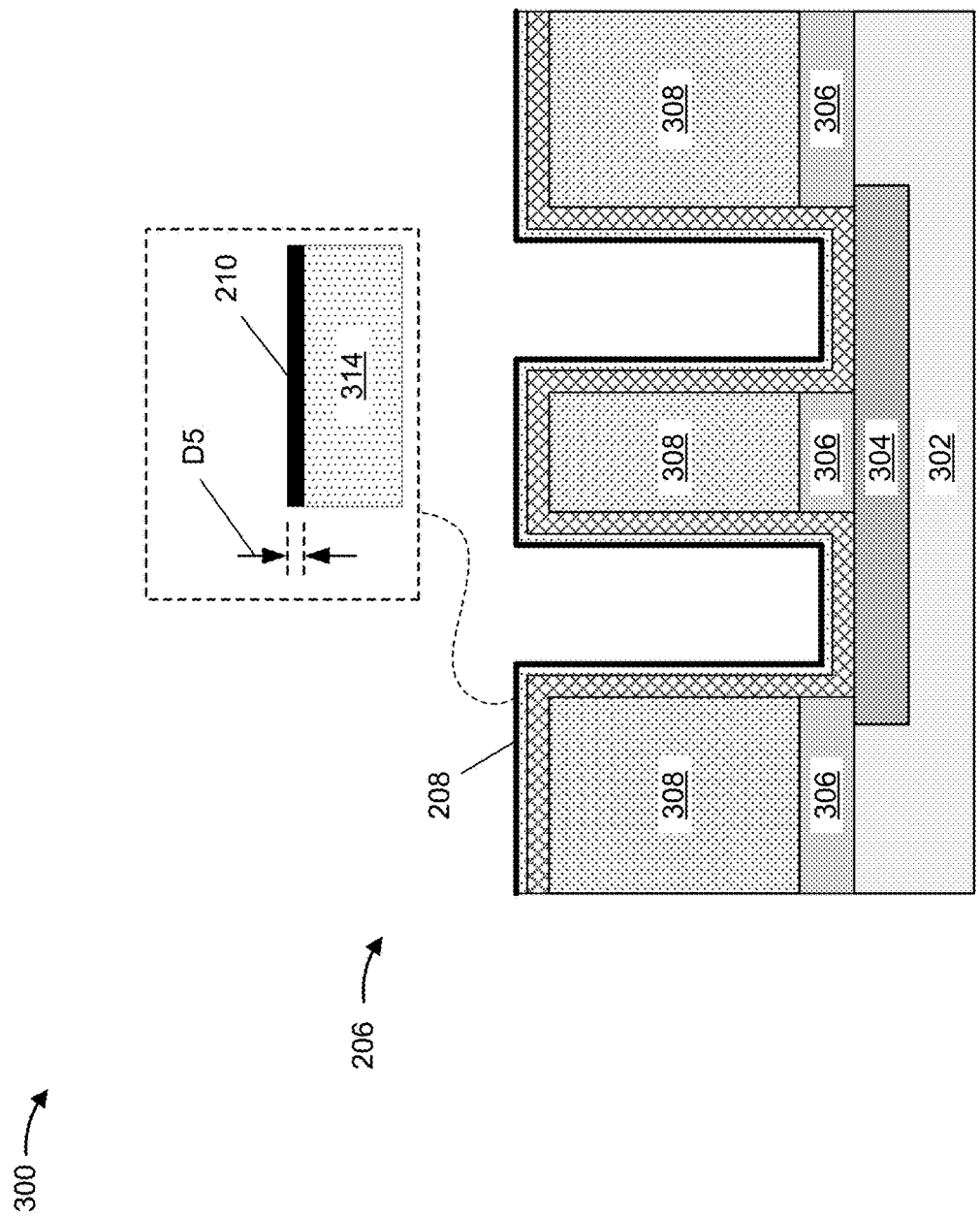

FIG. 3E shows an amorphous material layer 210 formed along contours of the coating treatment layer 314. In an implementation of the capacitor structure 206 that does not include the coating treatment layer 314, the amorphous material layer 210 is formed along contours of the CBM electrode layer 312.

The amorphous material layer 210 includes a bandgap energy level that provides a conduction band offset and lowers a probability of electron tunneling from the CBM electrode layer 312 to a subsequently formed dielectric layer of the capacitor structure 206 (e.g., the amorphous material layer 210 may perform as an electron tunneling blocking layer). This conduction band offset may reduce a likelihood of leakage within the capacitor structure 206 to improve a lag performance of the semiconductor device 202.

The bandgap energy level of the amorphous material layer 210 may be greater than approximately 5.8 electron volts (eV). If the bandgap energy level of the amorphous material layer 210 is less than or equal to approximately 5.8 eV, the amorphous material layer may be ineffective in performing as a tunneling blocking layer. For a bandgap energy level of greater than approximately 5.8 eV, the amorphous material layer 210 may include an aluminum oxide material ($Al_2O_3$) or a silicon dioxide material ($SiO_2$) material. Additionally, or alternatively, the amorphous material layer 210 may include an aluminum monoxide (AlO) material, a hafnium silicate ($HfSiO_4$) material, a lanthanum oxide ($La_2O_3$) material, an aluminum nitride (AlN) material, or a zirconium silicate ($ZrSiO_4$) material, among other examples.

In some implementations, the deposition tool 102 deposits the amorphous material layer 210 using an ALD deposition technique. A thickness D5 of the amorphous material layer 210 may be included in a range of approximately 2 angstroms to approximately 16 angstroms. If the thickness D5 is less than approximately 2 angstroms, a process capability of the deposition tool 102 (e.g., using the ALD deposition technique) may be exceeded. If the thickness D5 is greater than approximately 16 angstroms, a capacitance of the capacitor structure 206 may decrease below a targeted value. However, other values and ranges for the thickness D5 are within the scope of the present disclosure.

Figure 3F:
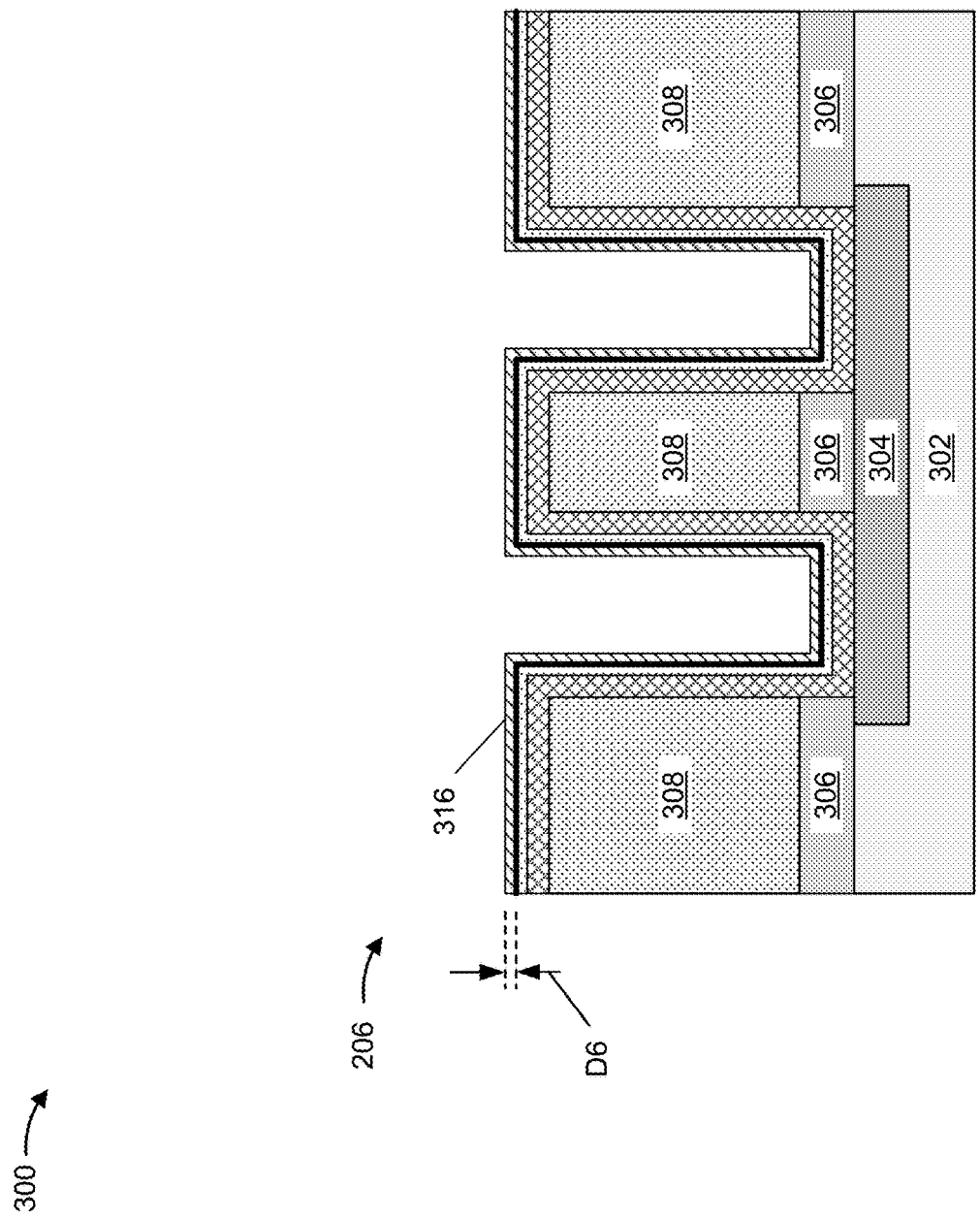

FIG. 3F shows an insulator layer stack 316 formed along contours of the amorphous material layer 210. As described in greater detail and in connection with FIGS. 5A-5D, the insulator layer stack 316 may include multiple layers of different materials, such as one or more layers of a zirconium dioxide ($ZrO_2$) material alternating with one or more layers of an aluminum oxide ($Al_2O_3$) material. A bottom layer of the insulator layer stack 316 may interface with the amorphous material layer 210, and include a bandgap energy level that is less than or equal to approximately 5.8 eV. If the bandgap energy level of the bottom layer of the insulator layer stack 316 is greater than approximately 5.8 eV, a conduction band offset between the amorphous material layer 210 and the bottom layer of the insulator layer stack 316 may not be sufficient to reduce a likelihood electron tunneling within the capacitor structure 206.

The insulator layer stack 316 may include a thickness D6. As an example, the thickness D6 may be included in range of approximately 54 nanometers to approximately 66 nanometers. However, other values and ranges for the thickness D6 are within the scope of the present disclosure. The deposition tool 102 may deposit one or more layers of the insulator layer stack 316 using a CVD technique, a PVD technique, an ALD technique described above in connection with FIG. 1, and/or another deposition technique.

Figure 3G:
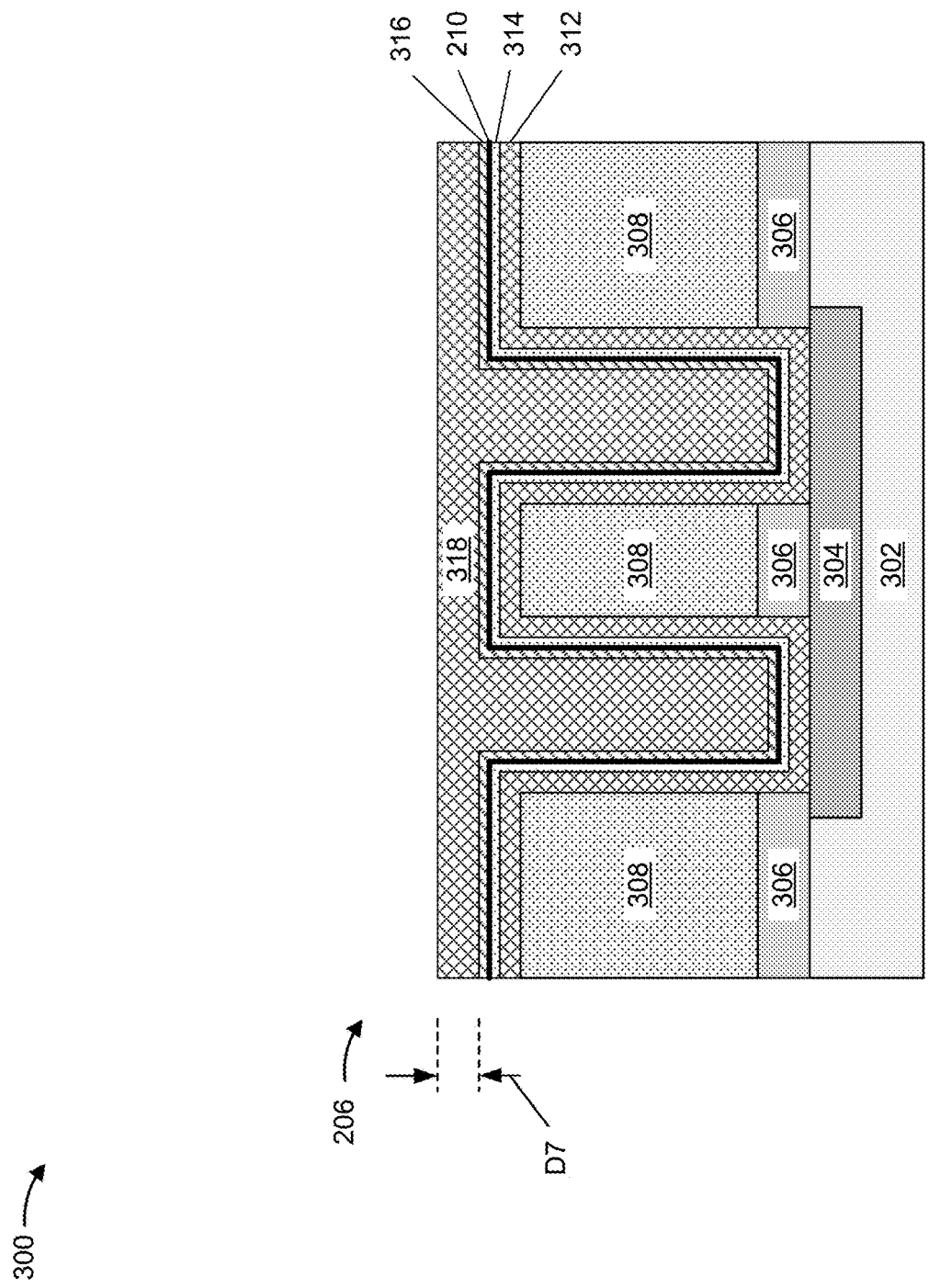

FIG. 3G shows a capacitor top metal (CTM) electrode layer 318 formed on the insulator layer stack 316. The CTM electrode layer 318 may include one or more of a tantalum (Ta) material, a tantalum nitride (TaN) material, or a titanium nitride (TiN) material, among other examples. A thickness D7 of the CTM electrode layer 318 may be included in a range of approximately 450 angstroms to approximately 550 angstroms. However, other values and ranges for the thickness D7 are within the scope of the present disclosure.

In some implementations, the deposition tool 102 deposits one or more layers of the CBM electrode layer 312 using a series of one or more deposition techniques. Such deposition techniques may include a CVD technique, a PVD technique, an ALD technique described above in connection with FIG. 1, and/or another deposition technique.

As indicated above, the number and arrangement of layers shown in FIGS. 3A-3G are provided as one or more examples. In practice, there may be additional layers, fewer layers different layers, or differently arranged layers than those shown in FIGS. 3A-3G. Furthermore, dimensions and/or material combinations of layers, beyond those shown in FIGS. 3A-3G, are within the scope of the present disclosure.

Figure 4:
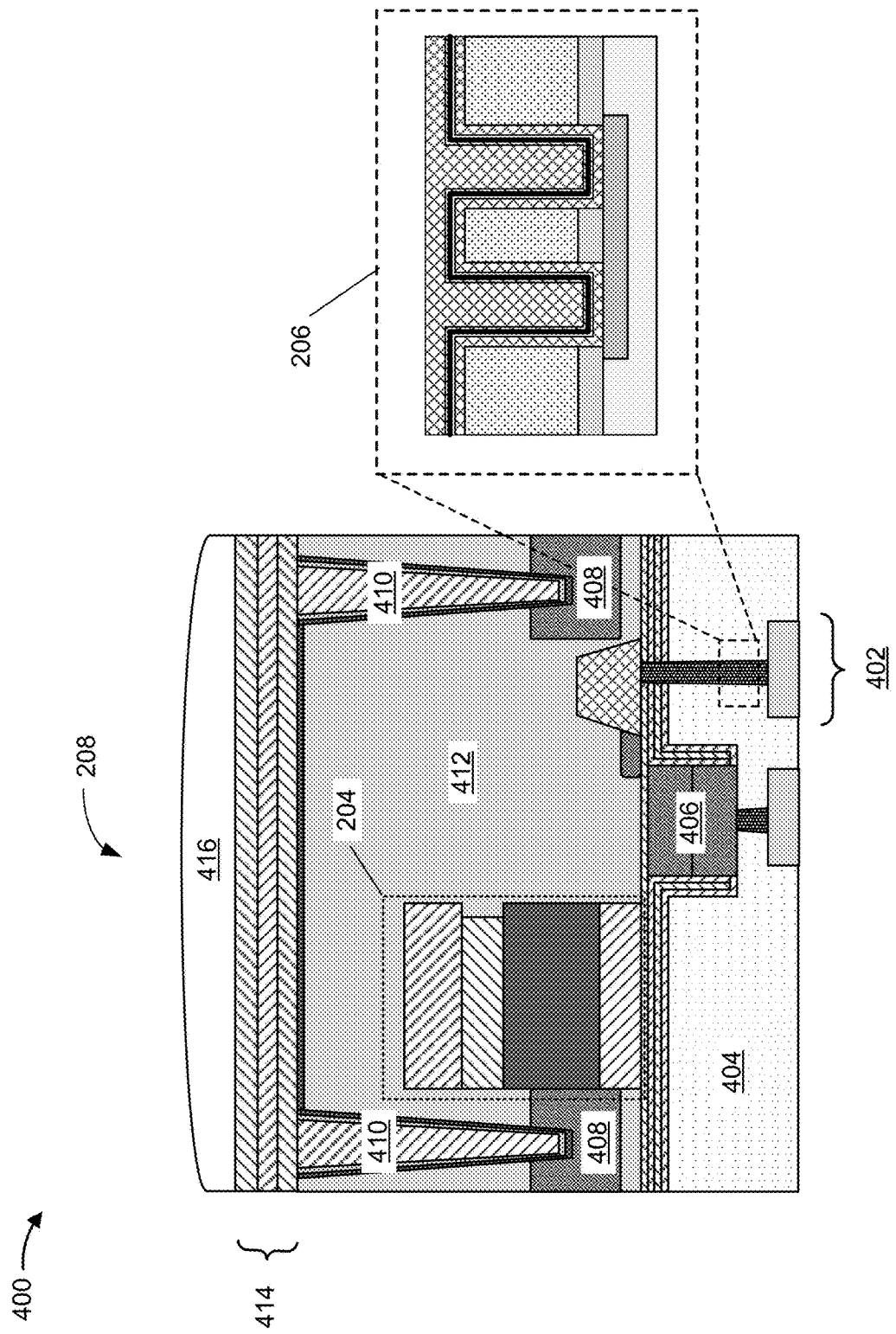

FIG. 4 is a diagram of an example implementation 400 described herein. The implementation 400 shows an example arrangement of the pixel 208 including the photodiode 204 and the capacitor structure 206. FIG. 4 includes an example section-view of the pixel 208.

In implementation 400, the photodiode 204 may include multiple layers of n-type regions. The capacitor structure 206 may correspond to a lateral overflow integration capacitor for the photodiode 204. In practice, a capacity of the photodiode 204 stores photocarriers (e.g., photocarriers generated by light received by the photodiode 204). For a case of the photodiode 204 receiving high intensity light, the photodiode 204 may be overwhelmed and provide an overflow charge to the capacitor structure 206.

The capacitor structure 206 may be included in a portion of conductive structure 402 that is formed in a dielectric layer 404. One or more operations performed by the semiconductor processing tools 102-112 may form the conductive structure 402 in the dielectric layer 404. The conductive structure 402 may include plugs, vias, columns, and/or other types of structures. The conductive structure 402 may be electrically connected to a transfer gate 406 between shallow trench isolation (STI) structures 408 of the semiconductor device 202. The semiconductor device 202 (e.g., a CMOS imager type of semiconductor device) may further include one or more full deep trench isolation (DTI) structures 410 to reduce, minimize, and/or prevent optical crosstalk in the semiconductor device 202.

One or more portions of the photodiode 204, the STI structures 408, and/or the DTI structures 410 may be formed in a substrate 412 (e.g., a substrate of the semiconductor device 202). One or more operations performed by the semiconductor processing tools 102-112 may form one or more portions of the photodiode 204, the STI structures 408, and/or the DTI structures 410 in a semiconductor die substrate, a semiconductor wafer, or another type of substrate, among other examples.

The pixel 208 may include a combination of one or more additional layers 414 (e.g., a p$^+$ ion layer to increase photon-electron conversion, an antireflective coating layer, and/or a color filter layer among other examples). Additionally, or alternatively, the pixel 208 may include a lens layer 416.

The number and arrangement of features and structures in the semiconductor device 202 of FIG. 4 are provided as one or more examples. In practice, there may be additional features and structures, fewer features and structures, different features and structures, or differently arranged features and structures than those shown in FIG. 4.

FIGS. 5A-5D are diagrams of an example implementation 500 described herein. The implementation 500 includes different configurations of the insulator layer stack 316 of the capacitor structure 206. The insulator layer stack 316 may correspond to a high-k dielectric film of the capacitor structure 206, and include multiple layers of different materials.

Figure 5A:
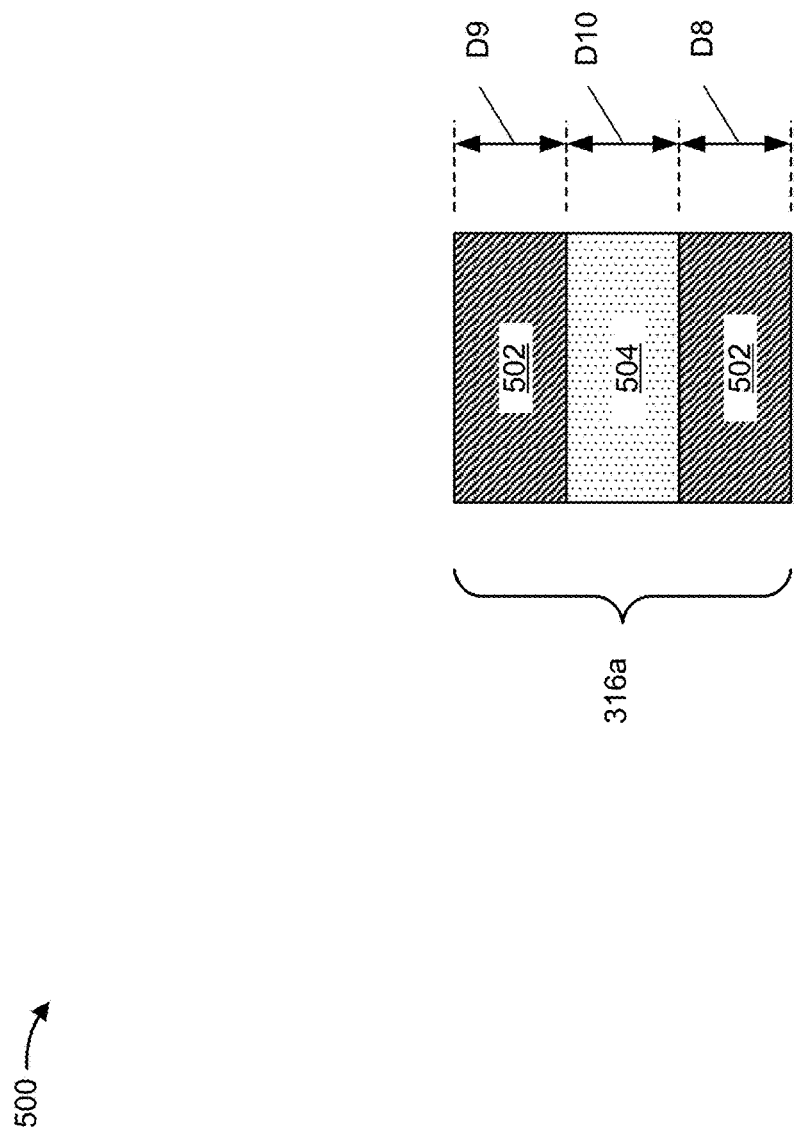

FIG. 5A shows an example insulator layer stack 316a which may be referred to as a "ZAZ" configuration. The insulator layer stack 316a includes two layers of material 502 and a layer of material 504 formed between the two layers of material 502. The layers of material 502 may include a zirconium dioxide ($ZrO_2$) material and have thicknesses D8 and D9. As an example, the thickness D8 may be included in a range of approximately 18 angstroms to approximately 22 angstroms. Additionally, or alternatively, the thickness D9 may be included in a range of approximately 18 angstroms to approximately 22 angstroms. However, other values and ranges for the thicknesses D8 and D9 are within the scope of the present disclosure. The deposition tool 102 may deposit the layers of material 502 using a CVD technique, a PVD technique, an ALD technique described above in connection with FIG. 1, and/or another deposition technique.

The insulator layer stack 316a shown in FIG. 5A further includes the layer of material 504. The layer of material 504 may include an aluminum oxide ($Al_2O_3$) material and have a thickness D10. As an example, the thickness D10 may be included in a range of approximately 18 angstroms to approximately 22 angstroms. However, other values and ranges for the thickness D10 are within the scope of the present disclosure. The deposition tool 102 may deposit the layer of material 504 using a CVD technique, a PVD technique, an ALD technique described above in connection with FIG. 1, and/or another deposition technique.

Figure 5B:
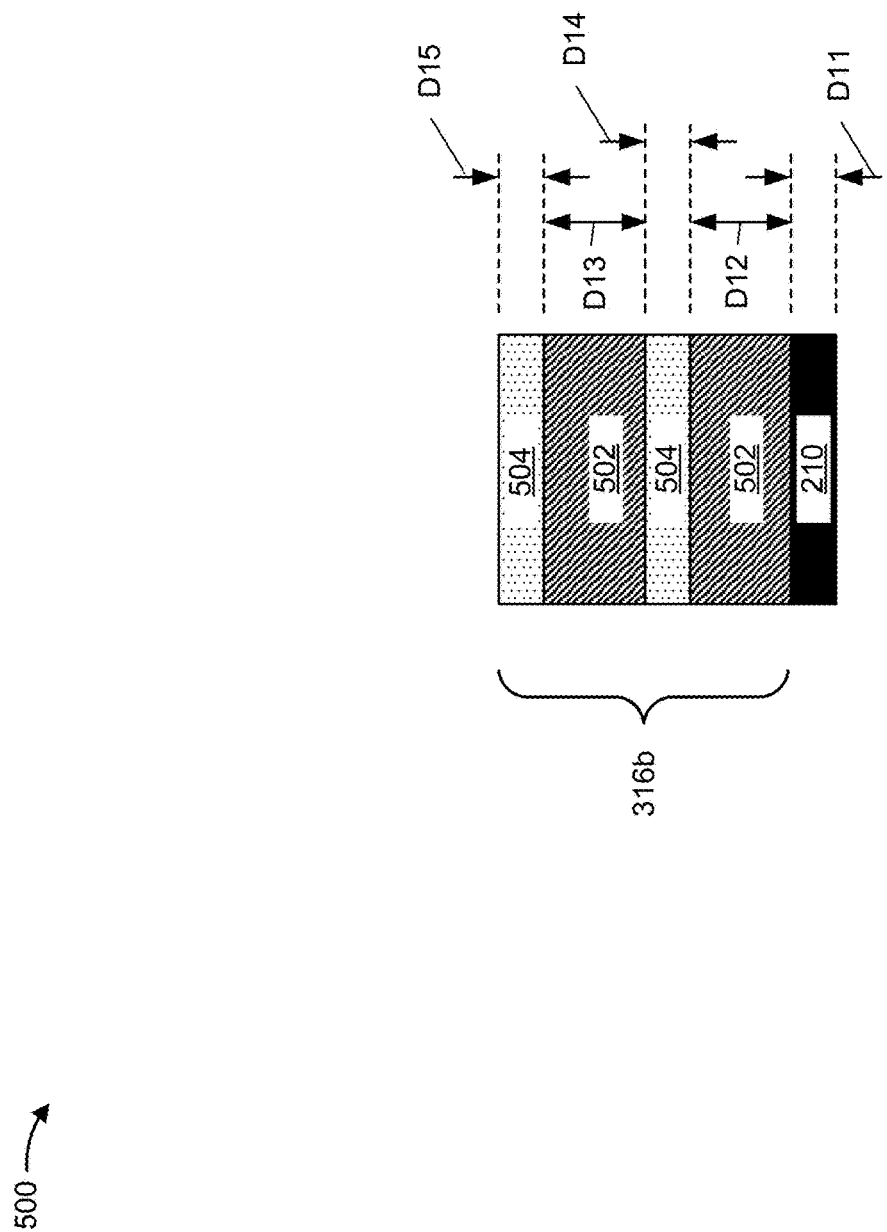

FIG. 5B shows of an example insulator layer stack 316b over the amorphous material layer 210. FIG. 5B may be referred to as an "AZAZ" configuration. In FIG. 5B, the amorphous material layer 210 may include an aluminum oxide ($Al_2O_3$) material and have a thickness D11. As an example, the thickness D11 may be included in a range of approximately 7.2 angstroms to approximately 8.8 angstroms. However, other values and ranges for the thickness D11 are within the scope of the present disclosure. The deposition tool 102 may deposit the amorphous material layer 210 using a CVD technique, a PVD technique, an ALD technique described above in connection with FIG. 1, and/or another deposition technique.

The insulator layer stack 316b includes two layers of material 502 alternating with two layers of material 504. The layers of material 502 may include a zirconium dioxide ($ZrO_2$) material and have thicknesses D12 and D13. As an example, the thickness D12 may be included in a range of approximately 16.2 angstroms to approximately 19.8 angstroms. Additionally, or alternatively, the thickness D13 may be included in a range of approximately 16.2 angstroms to approximately 19.8 angstroms. However, other values and ranges for the thicknesses D12 and D13 are within the scope of the present disclosure. The deposition tool 102 may deposit the layers of material 502 using a CVD technique, a PVD technique, an ALD technique described above in connection with FIG. 1, and/or another deposition technique.

The layers of material 504 shown in FIG. 5B may include an aluminum oxide ($Al_3O_2$) material and have thicknesses D14 and D15. As an example, the thickness D14 may be included in a range of approximately 7.2 angstroms to approximately 8.8 angstroms. Additionally, or alternatively, the thickness D15 may be included in a range of 7.2 angstroms to approximately 8.8 angstroms. However, other values and ranges for the thicknesses D14 and D15 are within the scope of the present disclosure. The deposition tool 102 may deposit the layers of material 504 using a CVD technique, a PVD technique, an ALD technique described above in connection with FIG. 1, and/or another deposition technique.

Figure 5C:
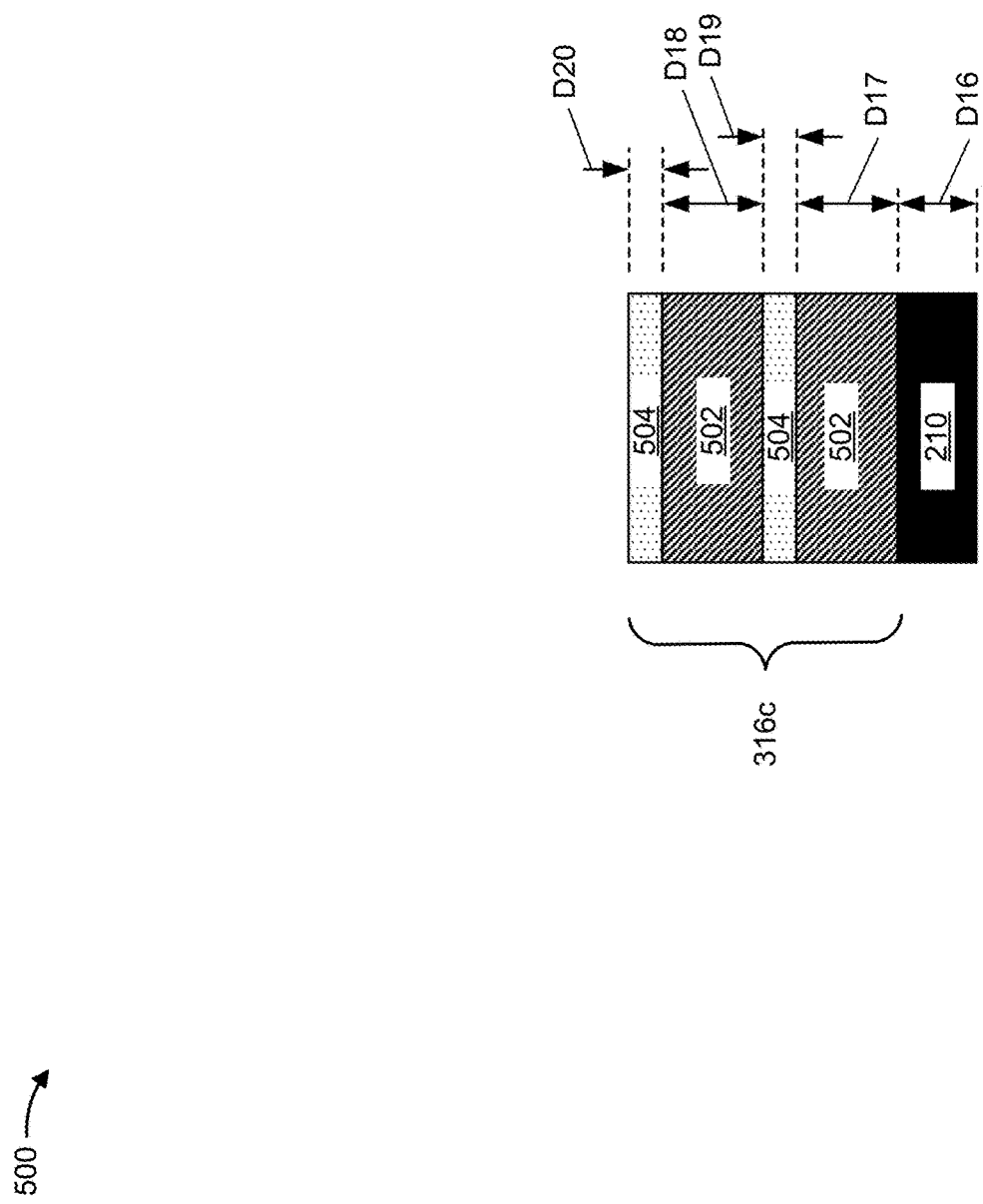

FIG. 5C shows an example insulator layer stack 316c over the amorphous material layer 210. FIG. 5C may be referred to as an "AZAZ" configuration. In FIG. 5C, the amorphous material layer 210 may include an aluminum oxide ($Al_2O_3$) material and have a thickness D16. As an example, the thickness D16 may be included in a range of approximately 10.8 angstroms to approximately 13.2 angstroms. However, other values and ranges for the thickness D16 are within the scope of the present disclosure. The deposition tool 102 may deposit the amorphous material layer 210 using a CVD technique, a PVD technique, an ALD technique described above in connection with FIG. 1, and/or another deposition technique.

The insulator layer stack 316c includes two layers of material 502 alternating with two layers of material 504. The layers of material 502 may include a zirconium dioxide ($ZrO_2$) material and have thicknesses D17 and D18. As an example, the thickness D17 may be included in a range of approximately 16.2 angstroms to approximately 19.8 angstroms. Additionally, or alternatively, the thickness D18 may be included in a range of approximately 16.2 angstroms to approximately 19.8 angstroms. However, other values and ranges for the thicknesses D17 and D18 are within the scope of the present disclosure. The deposition tool 102 may deposit the layers of material 502 using a CVD technique, a PVD technique, an ALD technique described above in connection with FIG. 1, and/or another deposition technique.

The layers of material 504 shown in FIG. 5C may include an aluminum oxide ($Al_3O_2$) material and have thicknesses D19 and D20. As an example, the thickness D19 may be included in a range of approximately 5.4 angstroms to approximately 6.6 angstroms. Additionally, or alternatively, the thickness D20 may be included in a range of 5.4 angstroms to approximately 6.6 angstroms. However, other values and ranges for the thicknesses D19 and D20 are within the scope of the present disclosure. The deposition tool 102 may deposit the layers of material 504 using a CVD technique, a PVD technique, an ALD technique described above in connection with FIG. 1, and/or another deposition technique.

Figure 5D:
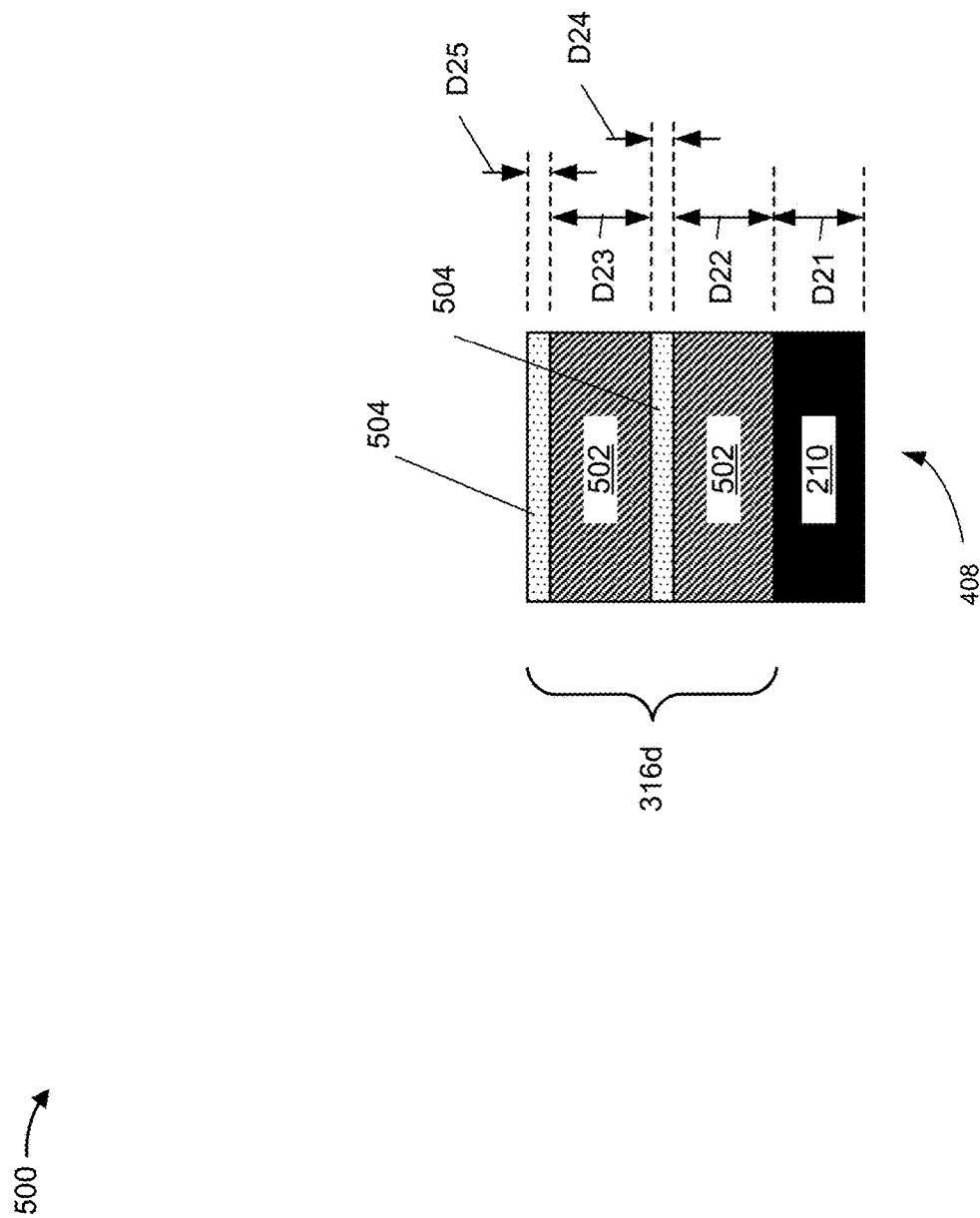

FIG. 5D shows an example insulator layer stack 316d over the amorphous material layer 210. FIG. 5D may be referred to as an "AZAZ" configuration. In FIG. 5D, the amorphous material layer 210 may include an aluminum oxide ($Al_2O_3$) material and have a thickness D21. As an example, the thickness D21 may be included in a range of approximately 14.4 angstroms to approximately 17.6 angstroms. However, other values and ranges for the thickness D21 are within the scope of the present disclosure. The deposition tool 102 may deposit the amorphous material layer 210 using a CVD technique, a PVD technique, an ALD technique described above in connection with FIG. 1, and/or another deposition technique.

The insulator layer stack 316d includes two layers of material 502 alternating with two layers of material 504. The layers of material 502 may include a zirconium dioxide ($ZrO_2$) material and have thicknesses D22 and D23. As an example, the thickness D22 may be included in a range of approximately 16.2 angstroms to approximately 19.8 angstroms. Additionally, or alternatively, the thickness D23 may be included in a range of approximately 16.2 angstroms to approximately 19.8 angstroms. However, other values and ranges for the thicknesses D22 and D23 are within the scope of the present disclosure. The deposition tool 102 may deposit the layers of material 502 using a CVD technique, a PVD technique, an ALD technique described above in connection with FIG. 1, and/or another deposition technique.

The layers of material 504 shown in FIG. 5D may include an aluminum oxide ($Al_3O_2$) material and have thicknesses D24 and D25. As an example, the thickness D24 may be included in a range of approximately 3.6 angstroms to approximately 4.4 angstroms. Additionally, or alternatively, the thickness D25 may be included in a range of 3.6 angstroms to approximately 4.4 angstroms. However, other values and ranges for the thicknesses D24 and D25 are within the scope of the present disclosure. The deposition tool 102 may deposit the layers of material 504 using a CVD technique, a PVD technique, an ALD technique described above in connection with FIG. 1, and/or another deposition technique.

The "AZAZ" configuration over the amorphous material layer 210 and the thicknesses of the layers of materials 502 and 504, as described in connection with FIGS. 5B-5D, are examples. Other example configurations that may be over the amorphous material layer 210 include a "ZAZ" configuration (e.g., $ZrO_2/Al_3O_2/ZrO_2$), a "ZAZA" configuration (e.g., $ZrO_2/Al_3O_2/ZrO_2/Al_3O_2$), a "ZAZAZ" configuration (e.g., $ZrO_2/Al_3O_2/ZrO_2/Al_3O_2/ZrO_2$), and/or an "AZA" configuration (e.g., $Al_3O_2/ZrO_2/Al_3O_2$), among other examples. Furthermore, thicknesses of the layers of materials 502 and 504 may be modified, altered, or "tuned" to a desired capacitance of the capacitor structure 206.

Configurations shown in FIGS. 5A-5D may be included in the capacitor structure 206. In some implementations, one or more of the configurations shown in FIGS. 5A-5D may be deposited directly on the CBM electrode layer 312 (e.g., the CBM electrode layer 312 without the coating treatment layer 314).

As described in connection with FIG. 6, configurations of FIGS. 5B-5D (e.g., insulator layer material stacks 316b-316d over the amorphous material layer 210) may exhibit delay effect or lag performance characteristics that are improved relative to the insulator layer stack 316a of FIG. 5A. The amorphous material layer 210 may include a bandgap energy level that provides a conduction band offset and lowers a probability of electron tunneling from the CBM electrode layer 312 to the insulator layer stack 316. In other words, leakages that may otherwise be associated with grain boundaries, crystal defects, and interfaces of a bottom layer of the insulator layer stack 316a of FIG. 5A may be overcome to improve a lag performance of the semiconductor device including the capacitor structure 206.

The number and arrangement of layers and materials in FIGS. 5A-5D are provided as one or more examples. In practice, there may be additional layers, fewer layers, different materials, or differently arranged layers and materials than those shown in FIGS. 5A-5D.

Figure 6:
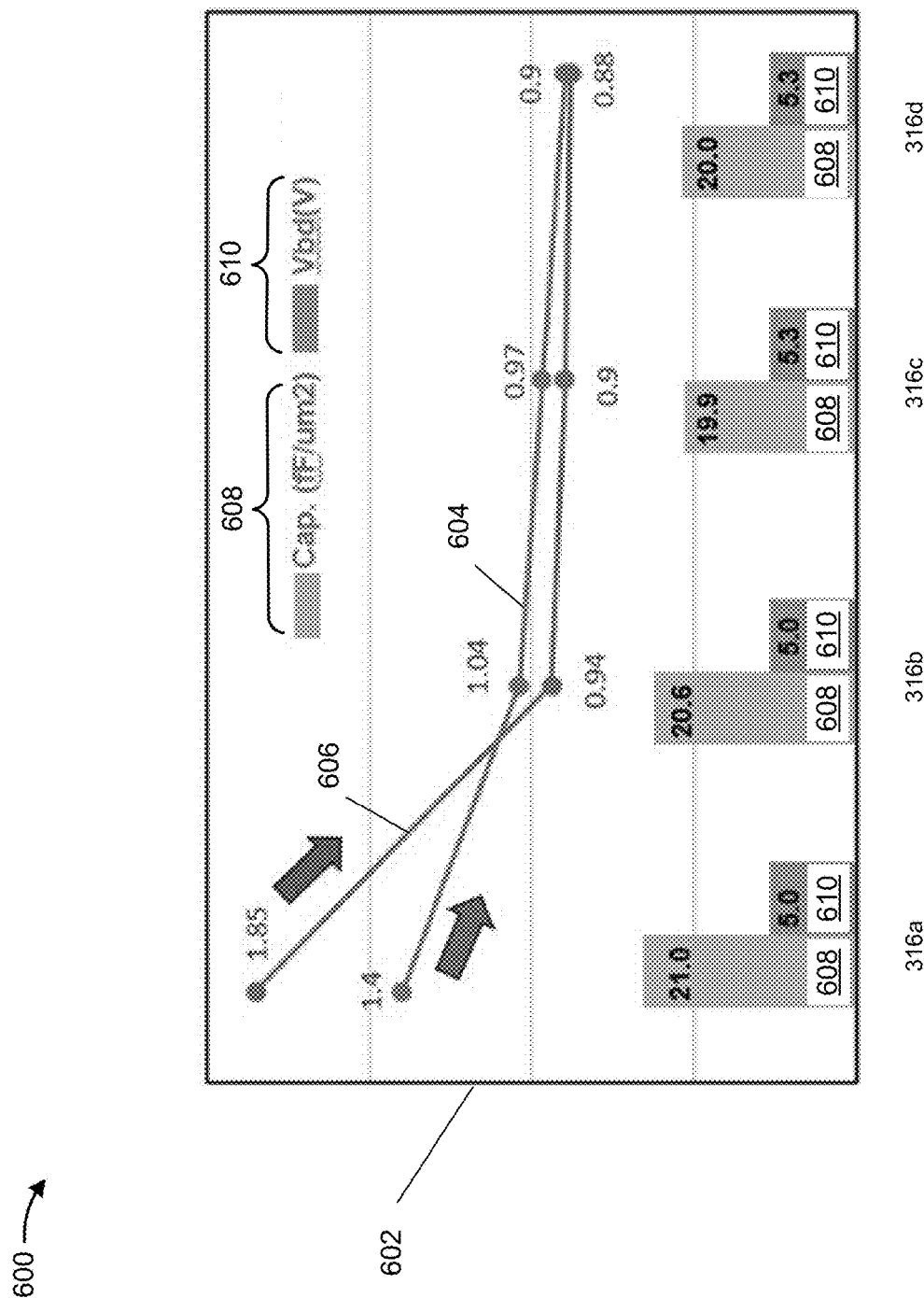
FIG. 6 is a diagram of example performance data of MIM devices described herein.

FIG. 6 is a diagram of example performance data 600 of MIM devices described herein. The performance data may correspond to the capacitor structure 206 including the amorphous material layer 210 and different configurations of the insulator layer stack 316 (e.g., the insulator layer stacks 316a-316d of FIGS. 5A-5D).

The performance data 600 quantifies a lag percentage 602 of the MIM deep-trench capacitor device (e.g., at a temperature 604 and at a temperature 606). As an example, the temperature 604 may correspond to approximately 25 degrees Celsius and the temperature 606 may correspond to approximately 125 degrees Celsius. However, other values for the temperature 604 and the temperature 606 are within the scope of the present disclosure. Additionally, the performance data 600 includes capacitance 608 in femtofarads per square micrometer (fF/$\mu$m$^2$) and breakdown voltage 610 in volts (V).

In some implementations, including the amorphous material layer 210 in the capacitor structure 206 improves the lag performance (e.g., the lag percentage 602) without degradation of the breakdown voltage 610. To maintain a desired capacitance of the capacitor structure 206 including the amorphous material layer 210, a thickness of a layer within the insulator layers stack 316b-316d (e.g., one or more of the thicknesses D8-D10, D12-D15, D17-D20, or D22-D25) may be adjusted accordingly.

As shown in the example performance data, the lag percentage 602 of insulator layer stacks 316b-316d over the amorphous material layer 210 (e.g., the "AZAZA" configurations) may be improved relative to the insulator layer stack 316a without the amorphous material layer 210 (e.g., the "ZAZ" configuration). Furthermore, the improvement may be greater at a higher temperature (e.g., the temperature 606), which may make the insulator layer stacks 316b-316d over the amorphous material layer 210 suitable for automotive purposes.

Additionally, the insulator layer stack 316d over the amorphous material layer 210 (e.g., the amorphous material layer 210 with the thickness D21 of approximately 14.4 angstroms to approximately 17.6 angstroms) appears to provide the greatest relative improvement in lag performance.

As indicated above, FIG. 6 is provided as an example. Other examples may differ from what is described with regard to FIG. 6.

Figure 7:
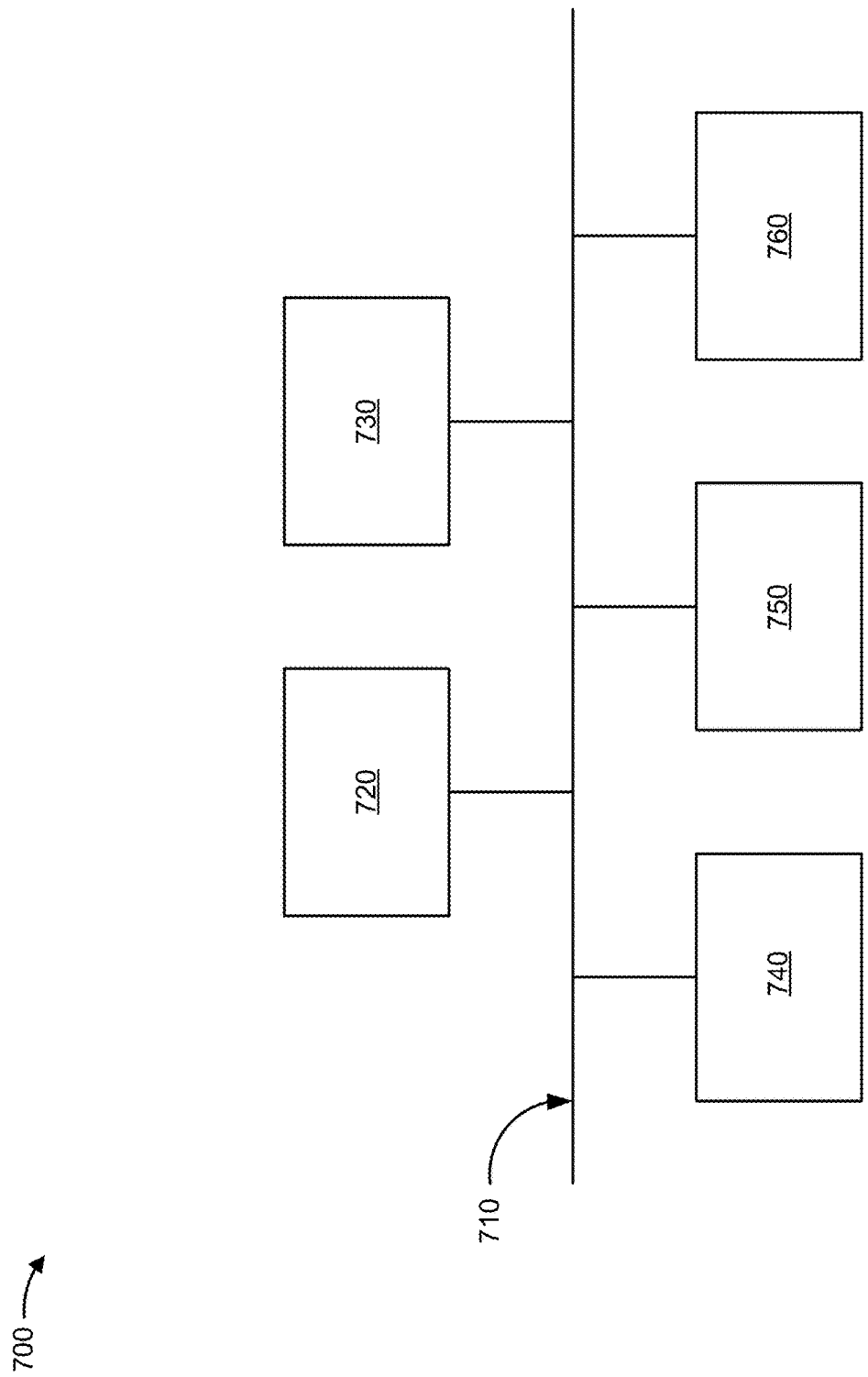
FIG. 7 is a diagram of example components of one or more devices of FIG. 1 described herein.

FIG. 7 is a diagram of example components of one or more devices of FIG. 1 described herein. In some implementations, one or more of the semiconductor processing tools 102-112 include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
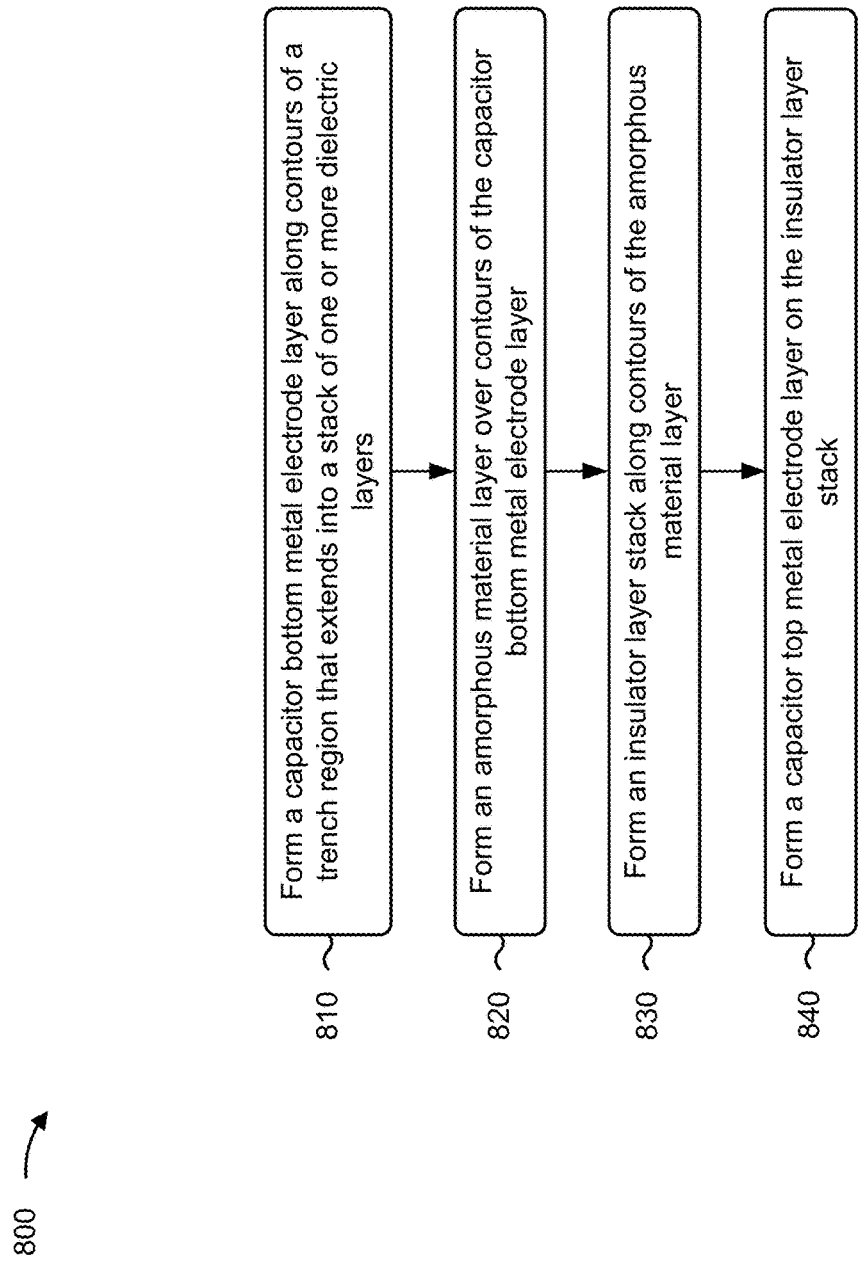
FIG. 8 is a flowchart of an example process associated a MIM device described herein.

FIG. 8 is a flowchart of an example process 800 associated with a MIM deep-trench capacitor and methods of manufacturing. In some implementations, one or more process blocks of FIG. 8 are performed by one or more of the semiconductor processing tools 102-112. Additionally, or alternatively, one or more process blocks of FIG. 8 may be performed by one or more components of device 700, such as processor 720, memory 730, input component 740, output component 750, and/or communication component 760.

As shown in FIG. 8, process 800 may include forming a capacitor bottom metal electrode layer along contours of a trench region that extends into a stack of one or more dielectric layers (block 810). For example, one or more of the semiconductor processing tools 102-112, such as the deposition tool 102, may form a CBM electrode layer 312 along contours of a trench region 310 that extends into a stack of one or more dielectric layers 306, 308 as described above.

As further shown in FIG. 8, process 800 may include forming an amorphous material layer along contours of the capacitor bottom metal electrode layer (block 820). For example, one or more of the semiconductor processing tools 102-112, such as the deposition tool 102, may form an amorphous material layer 210 over contours of the capacitor bottom metal electrode layer 312, as described above. In some implementations, the amorphous material layer 210 includes a first bandgap.

As further shown in FIG. 8, process 800 may include forming an insulator layer stack along contours of the amorphous material layer (block 830). For example, the one or more of the semiconductor processing tools 102-112, such as the deposition tool 102, may form an insulator layer stack 316 along contours of the amorphous material layer 210, as described above. In some implementations, a bottom layer of the insulator layer stack 316 includes a second bandgap that is lesser relative to the first bandgap.

As further shown in FIG. 8, process 800 may include forming a capacitor top metal electrode layer on the insulator layer stack (block 840). For example, one or more of the semiconductor processing tools 102-112, such as the deposition tool 102, may form a capacitor top metal electrode layer 318 on the insulator layer stack 316, as described above.

Process 800 may include additional implementations, such as any single implementation or any combination of implementations described below and/or in connection with one or more other processes described elsewhere herein.

In a first implementation, forming the amorphous material layer 210 includes forming the amorphous material layer 210 using an atomic layer deposition process.

In a second implementation, alone or in combination with the first implementation, the atomic layer deposition process deposits silicon dioxide to form the amorphous material layer 210.

In a third implementation, alone or in combination with one or more of the first and second implementations, the atomic layer deposition process deposits aluminum oxide to form the amorphous material layer 210.

In a fourth implementation, alone or in combination with one or more of the first through third implementations, the atomic layer deposition process deposits an amorphous material having a bandgap that is greater than approximately 5.8 electron volts to form the amorphous material layer 210.

In a fifth implementation, alone or in combination with one or more of the first through fourth implementations, process 800 includes forming a coating treatment layer 314 on the capacitor bottom metal electrode layer 312 prior to forming the amorphous material layer 210.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein provide a semiconductor device and methods of formation. The semiconductor device may include a photodiode device electrically connected to a MIM deep-trench capacitor. The MIM deep-trench capacitor includes a layer of an amorphous material between an insulator layer stack of the deep-trench capacitor structure and a CBM layer of the MIM deep-trench capacitor. The amorphous material includes a bandgap energy level that provides a conduction band offset and lowers a probability of electron tunneling from the CBM electrode layer to the insulator layer stack.

In this way, leakage associated with grain boundaries, crystal defects, and interfaces of a bottom layer of the insulator layer stack may be overcome or reduce a lag performance or delay effect of the semiconductor device including the MIM deep-trench capacitor.

As described in greater detail above, some implementations described herein provide a device. The device includes a metal layer. The device includes a deep-trench capacitor structure over the metal layer comprising, a capacitor bottom metal electrode layer on the metal layer, a coating treatment layer on the capacitor bottom metal electrode layer, and an amorphous material layer on the coating treatment layer. In some implementations, the amorphous material layer comprises a first bandgap. The device includes an insulator layer stack on the amorphous material layer. In some implementations, the insulator layer stack includes a bottom material layer having a second bandgap that is lesser relative to the first bandgap.

As described in greater detail above, some implementations described herein provide a method. The method includes forming a capacitor bottom metal electrode layer along contours of a trench region that extends into a stack of one or more dielectric layers. The method includes forming an amorphous material layer over contours of the capacitor bottom metal electrode layer, where the amorphous material layer includes a first bandgap. The method includes forming an insulator layer stack along contours of the amorphous material layer, where a bottom layer of the insulator layer stack includes a second bandgap that is lesser relative to the first bandgap. The method includes forming a capacitor top metal electrode layer on the insulator layer stack.

As described in greater detail above, some implementations described herein provide a semiconductor device. The semiconductor device includes a capacitor structure. The capacitor structure includes a capacitor bottom metal electrode layer and an amorphous material layer over the capacitor bottom metal electrode layer. In some implementations, the amorphous material layer includes a first bandgap. The capacitor structure includes an insulator layer stack including a bottom layer on the amorphous material layer. In some implementations, the bottom layer includes a second bandgap that is lesser relative to the first bandgap. The semiconductor device includes integrated circuitry having a photodiode that is electrically connected to the capacitor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a metal layer;
one or more dielectric layers at least partially on the metal layer, wherein the one or more dielectric layers comprises a trench region exposing a portion of the metal layer; and
a capacitor structure comprising:
a capacitor bottom metal electrode layer in the trench region and on the portion of the metal layer;
a coating treatment layer on an entire inner periphery of the capacitor bottom metal electrode layer;
an amorphous material layer on the coating treatment layer,
wherein the amorphous material layer comprises a first bandgap; and
an insulator layer stack on the amorphous material layer,
wherein the insulator layer stack comprises a bottom material layer comprising a second bandgap that is lesser relative to the first bandgap.

2. The device of claim 1, wherein the coating treatment layer comprises:
a titanium oxy nitride material.

3. The device of claim 1, wherein the amorphous material layer comprises:
an aluminum oxide material, and
wherein the bottom material layer comprises a zirconium dioxide material.

4. The device of claim 1, wherein the amorphous material layer comprises:
a silicon dioxide material, and
wherein the bottom material layer comprises a zirconium dioxide material, or
wherein the bottom material layer comprises an aluminum oxide material.

5. The device of claim 1, wherein the second bandgap is less than approximately 5.8 electron volts.

6. The device of claim 1, wherein the amorphous material layer comprises:
a thickness that is included in a range of approximately 2 angstroms to approximately 16 angstroms.

7. The device of claim 1, wherein the insulator layer stack comprises:
at least one layer of an aluminum oxide material.

8. The device of claim 1, wherein the insulator layer stack comprises:
at least one layer of a zirconium dioxide material.

9. The device of claim 1, wherein the amorphous material layer includes an aluminum monoxide material, a hafnium silicate material, a lanthanum oxide material, an aluminum nitride material, or a zirconium silicate material.

10. A semiconductor device, comprising:
a stack of dielectric layers comprising a trench region exposing a portion of a metal layer at least partially under the stack of dielectric layers;
a capacitor structure comprising:
a capacitor bottom metal electrode layer in the trench region and on an entire inner periphery of the portion of the metal layer;
an amorphous material layer over the capacitor bottom metal electrode layer,
wherein the amorphous material layer comprises a first bandgap; and
an insulator layer stack comprising a bottom layer on the amorphous material layer,
wherein the bottom layer comprises a second bandgap that is lesser relative to the first bandgap; and
integrated circuitry comprising a photodiode that is electrically connected to the capacitor structure.

11. The semiconductor device of claim 10, wherein the semiconductor device corresponds to an image sensor device, and
wherein the capacitor structure is configured as a lateral overflow integration capacitor to improve a lag performance of the image sensor device.

12. The semiconductor device of claim 10, wherein the capacitor structure corresponds to a metal-insulator-metal capacitor structure.

13. The semiconductor device of claim 10, wherein the capacitor bottom metal electrode layer is along a contour of the trench region.

14. The semiconductor device of claim 10, further comprising:
a coating treatment layer between the capacitor bottom metal electrode layer and the amorphous material layer.

15. A device, comprising:
one or more first dielectric layers on a second dielectric layer and a metal layer, wherein the one or more first dielectric layers comprises a trench region exposing a portion of the metal layer;
a capacitor bottom metal electrode layer in the trench region and on the portion of the metal layer;
a coating treatment layer on an entire inner periphery of the capacitor bottom metal electrode layer;
an amorphous material layer on the coating treatment layer; and
an insulator layer stack on the amorphous material layer.

16. The device of claim 15, wherein the amorphous material layer comprises: a silicon dioxide material.

17. The device of claim 15, wherein the amorphous material layer comprises:
a thickness that is less than approximately 2 angstroms or greater than approximately 16 angstroms.

18. The device of claim 15, wherein the insulator layer stack comprises a zirconium dioxide material.

19. The device of claim 15, wherein the one or more first dielectric layers comprises at least one of:
an inter-layer dielectric (ILD) layer, or
an upper inter-metal dielectric (IMD) layer.

20. The device of claim 15, wherein the second dielectric layer comprises an inter-metal dielectric (IMD) layer.

* * * * *